United States Patent
Zhuo et al.

(10) Patent No.: US 11,581,693 B2
(45) Date of Patent: Feb. 14, 2023

(54) PULSED LASER DRIVER

(71) Applicant: PHOTONIC TECHNOLOGIES (SHANGHAI) CO., LTD., Shanghai (CN)

(72) Inventors: Shenglong Zhuo, Shanghai (CN); Patrick Yin Chiang, Shanghai (CN)

(73) Assignee: Photonic Technologies (Shanghai) CO., LTD., Shanghai (CN)

( * ) Notice: Subject to any disclaimer, the term of this patent is extended or adjusted under 35 U.S.C. 154(b) by 751 days.

(21) Appl. No.: 16/582,478

(22) Filed: Sep. 25, 2019

(65) Prior Publication Data

US 2021/0028592 A1 Jan. 28, 2021

(30) Foreign Application Priority Data

Jul. 26, 2019 (CN) .......................... 201910680287.X

(51) Int. Cl.

| | |
|---|---|
| *H01S 3/00* | (2006.01) |
| *H01S 3/09* | (2006.01) |
| *H01S 3/11* | (2023.01) |
| *H03K 17/60* | (2006.01) |
| *H03K 17/687* | (2006.01) |

(Continued)

(52) U.S. Cl.
CPC ................. *H01S 3/09* (2013.01); *H01S 3/11* (2013.01); *H03K 17/60* (2013.01); *H03K 17/6871* (2013.01); *G01S 7/484* (2013.01); *G01S 17/10* (2013.01)

(58) Field of Classification Search
CPC .. H01S 3/09; H01S 3/11; H03K 17/60; H03K 17/6871; G01S 7/484; G01S 17/10
See application file for complete search history.

(56) References Cited

U.S. PATENT DOCUMENTS

| | | | |
|---|---|---|---|
| 7,864,827 B1 | 1/2011 | Neron | |
| 9,784,835 B1 * | 10/2017 | Droz | ...................... G08G 1/166 |

(Continued)

FOREIGN PATENT DOCUMENTS

| | | |
|---|---|---|
| CN | 1543028 A | 11/2004 |
| CN | 108321676 A | 7/2008 |

(Continued)

OTHER PUBLICATIONS

International Search Report dated Jul. 22, 2020 issued in corresponding application PCT/CN2020/096312 (5 pages).

(Continued)

*Primary Examiner* — Mark Hellner
(74) *Attorney, Agent, or Firm* — Polsinelli PC

(57) ABSTRACT

The disclosure relates to a pulsed laser driver that utilizes a high-voltage switch transistor to support a high output voltage for a laser, and a low-voltage switch transistor that switches between an ON state and an OFF state to generate a pulsed current that is supplied to the laser to generate an output pulsed laser signal. The pulsed laser driver switches the low-voltage switch transistor between the ON state and the OFF state according to an input pulsed signal such that the output pulsed laser signal is modulated according to the input pulsed signal. The pulsed laser driver also utilizes a feedback control module to control the gate terminal voltage of the high-voltage switch transistor to improve the precision of the output pulsed laser signal.

18 Claims, 2 Drawing Sheets

(51) Int. Cl.
   *G01S 7/484* (2006.01)
   *G01S 17/10* (2020.01)

(56) References Cited

U.S. PATENT DOCUMENTS 10,256,605 B2 * 4/2019 Gassend ............ H01S 5/06817
2007/0280315 A1   12/2007 Mizuno

FOREIGN PATENT DOCUMENTS

| | | |
|---|---|---|
| CN | 101252314 A | 8/2008 |
| CN | 109891690 A | 6/2019 |
| CN | 209150484 U | 7/2019 |
| CN | 110190506 A | 8/2019 |
| CN | 110233420 A | 9/2019 |
| CN | 110391589 A | 10/2019 |
| CN | 110401103 A | 11/2019 |
| CN | 209805095 U | 12/2019 |
| CN | 209913236 U | 1/2020 |
| JP | 02-54977 A | 2/1990 |
| JP | 2715491 B2 | 2/1998 |
| WO | WO 2020142949 A1 * | 7/2020 ............ G01S 7/484 |

OTHER PUBLICATIONS

Notification of Transmittal of the International Search Report and Written Opinion of the International Searching Authority, or the Declaration dated Jul. 22, 2020 issued in corresponding application PCT/CN2020/096312 (1 page).
Chinese Office Action dated Mar. 20, 2020 issued in corresponding Patent Application No. 201910680287.X (12 pages).

* cited by examiner

PULSED LASER DRIVER

CROSS REFERENCE TO RELATED APPLICATIONS

This application claims the priority to Chinese Application No. CN 201910680287.X, filed on Jul. 26, 2019. Afore-mentioned references are herein incorporated by reference in their entireties.

TECHNICAL FIELD

The present disclosure is directed to laser radar and three-dimensional detection techniques, and particularly to high-speed, high-voltage-margin, high-power, high-precision pulsed laser drivers.

BACKGROUND

Automatic driving, gesture recognition and machine vision all need high-precision, high-resolution, real-time range finding techniques. As such, the laser radar technology based on Time-of-Flight (TOF) of photonics has been widely used. The TOF-based laser radar technology involves a transmitting end and a receiving end. The transmitting end generates a pulse-modulated laser signal, and the receiving end detects an optical signal reflected from a target object and calculates the distance to the target object according to the TOE The distance measurement and measurement performance are mainly influenced by the power of the transmitting end and the sensitivity of the receiving end. Accordingly, in order to improve the distance measurement and the measurement performance, the transmitting end needs to generate a pulsed laser signal having a higher power as well as shortened rising and falling time intervals, and therefore needs a high-speed, high-voltage-margin, high-power, high-precision pulsed laser driver.

SUMMARY

The present disclosure provides a pulsed laser driver. The pulsed laser driver includes a laser, a first field effect transistor connected to the laser, and a second field effect transistor connected to the first field effect transistor. An output voltage of the pulsed laser driver is the drain terminal voltage of the first field effect transistor. The second field effect transistor generates a pulsed current that flows through the first field effect transistor to the laser to generate an output pulsed laser signal associated with the output voltage of the pulsed laser driver. The second field effect transistor generates the pulsed current according to the gate terminal voltage of the second field effect transistor. A magnitude of an output current of the pulsed laser driver is adjustable according to the gate terminal voltage of the first field effect transistor.

DETAILED DESCRIPTION OF THE EMBODIMENTS

In the following discussion, the present disclosure is described with reference to the accompanying drawings and detailed embodiments. However, the drawings and detailed embodiments are provided for merely illustrative purposes, and are not intended to limit the protection scope of the present disclosure.

Figure 1:
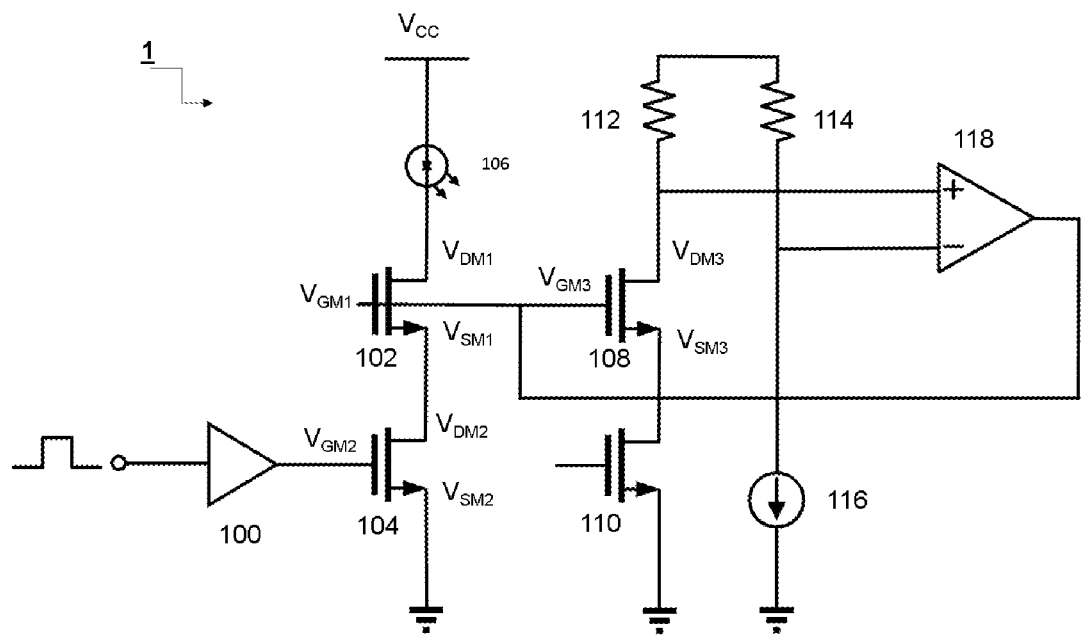
FIG. 1 illustrates a pulsed laser driver according to one embodiment.

FIG. 1 illustrates a pulsed laser driver 1 according to one embodiment. The pulsed laser driver 1 includes a pulsed laser signal generating module and a feedback control module. The pulsed laser signal generating module includes a pre-driver 100, a switch transistor 102, a switch transistor 104, and a laser 106. The switch transistor 102 and the switch transistor 104 of this embodiment are Field-Effect-Transistors ("FETs"). According to some embodiments of the present disclosure, the switch transistor 102 and the switch transistor 104 may be Bipolar-Junction-Transistors ("BJTs"). The gate terminal voltage, the drain terminal voltage, and the source terminal voltage of the switch transistor 102 are denoted $V_{GM1}$, $V_{DM1}$, and $V_{SM1}$ respectively. The gate terminal voltage, the drain terminal voltage, and the source terminal voltage of the switch transistor 104 are denoted $V_{GM2}$, $V_{DM2}$, and $V_{SM2}$ respectively. One end of the laser 106 is supplied with a bias voltage $V_{CC}$, and the other end of the laser 106 is connected to the drain terminal of the switch transistor 102. The source terminal of the switch transistor 102 is connected to the drain terminal of the switch transistor 104. The pre-driver 100 receives an input pulsed signal. The output end of the pre-driver 100 is connected to the gate terminal of the switch transistor 104. The switch transistor 104 switches between an ON state and an OFF state according to the input pulsed signal. When the switch transistor 104 is in the ON state, the output current of the pulsed laser driver 1 is the current $I_{M1}$ (not shown) flowing from the drain terminal of the switch transistor 102 to the source terminal of the switch transistor 102, and the output voltage of the pulsed laser driver 1 is the drain terminal voltage $V_{DM1}$ of the switch transistor 102. The magnitude of the output current $I_{M1}$ is determined by the gain terminal voltage $V_{GM1}$ of the switch transistor 102. When the switch transistor 104 is in the OFF state, the output current of the pulsed laser driver 1 is zero. By switching the switch transistor 104 between the ON state and the OFF state, the switching of the output current is achieved. Also, a pulsed current is generated as a result of the switching of the switch transistor 104 between the ON state and the OFF state. The pulsed current is supplied to the laser 106 to generate an output pulsed laser signal. Because the output voltage is the drain terminal voltage $V_{DM1}$ of the switch transistor 102, the switch transistor 102 may be a high-voltage transistor to sustain a bigger output voltage. Correspondingly, the switch transistor 104 may be a low-voltage transistor and therefore has a smaller parasitic capacitance, and the gate terminal of the low-voltage switch transistor 104 requires a smaller voltage swing, thereby providing a higher switching speed for the switch transistor 104 and a faster switching speed for the output current consequentially. The pulsed laser driver 1 utilizes the high-voltage switch transistor 102 to support a higher output voltage, and meanwhile utilizes the low-voltage switch transistor 104 to achieve high-speed switching of the output current, thereby providing a high-speed, high-voltage-margin, high-power pulsed laser driver. Further, the pulsed laser driver 1 utilizes the input pulsed signal to control the switch transistor 104 to switch between the ON state and the OFF state, and therefore controls the switching of the output current, thereby modulating the output pulsed laser signal according to the input pulsed signal. The feedback control module of the pulsed laser driver 1, by controlling the gain terminal voltage $V_{GM1}$ of the switch transistor 102, controls the magnitude of the output current $I_{M1}$, thereby improving the precision of the output pulsed laser signal. Accordingly, the pulsed laser driver 1 is a high-speed, high-voltage-margin, high-power, high-precision pulsed laser driver. Also, because the switch transistor 104 is a low-voltage transistor with a smaller size, the switching speed is higher, and the switching speed of the output current is improved greatly. When the switch transistor 104 is in the ON state, the source terminal of the switch transistor 102 is effectively pulled to the ground, further improving the switching speed, meanwhile increasing the output voltage margin, reducing the power voltage of the laser 106, reducing the power consumption, and improving the efficiency of the driver. Because the gate terminal of the low-voltage switch transistor 104 controlled by the pre-driver 100 requires a smaller voltage swing and the capacitance of the switch transistor 104 is smaller, the working speed of the pre-driver 100 is improved and the power consumption of the pre-driver 100 is lowered.

With further reference to FIG. 1, the pre-driver 100 transforms the driving signals and improves the driving abilities. According to some embodiments of the present disclosure, the pre-driver 100 matches the driving abilities of the input pulsed signals with the equivalent input impedance of the switch transistor 104. According to some embodiments of the present disclosure, the pre-driver 100 also matches the interface protocols (e.g., voltage swing, single-ended/differential) of the input pulsed signal with the types of driving signals needed by the switch transistor 104.

Still with further reference to FIG. 1, according to some embodiments of the present disclosure, the feedback control module of the pulsed laser driver 1 includes a current control feedback loop that is formed by a switch transistor 108, a switch transistor 110, a resistor 112, a resistor 114, a current source 116, and an amplifier 118. The gate terminal voltage, the drain terminal voltage, and the source terminal voltage of the switch transistor 108 are denoted $V_{GM3}$, $V_{GM3}$, and $V_{SM3}$ respectively. The gate terminal voltage $V_{GM3}$ of the switch transistor 108 is associated with the gate terminal voltage $V_{GM1}$ of the switch transistor 102. The resistor 112 is connected to the drain terminal of the switch transistor 108, and the source terminal of the switch transistor 108 is connected to the drain terminal of the switch transistor 110. The resistor 114 is connected to the current source 116. The switch transistor 108 and the switch transistor 110 output a mirror current that flows to the resistor 112 to generate a feedback voltage. The current source 116 generates a reference current that flows to the resistor 114 to generate a reference voltage. The differential voltage between the feedback voltage and the reference voltage is amplified by the amplifier 118 and returned to the gate terminal of the switch transistor 108. As such, when the current control feedback loop converges, the feedback voltage is equal to the reference voltage, thereby causing the output current of the switch transistor 108 equal to the reference current of the current source 116, further controlling the gate terminal voltage $V_{GM3}$ of the switch transistor 108 and the associated gate terminal voltage $V_{GM1}$ of the switch transistor 102, further controlling the magnitude of the output current $I_{M1}$ of the pulsed laser driver 1. Therefore, the pulsed laser driver 1 utilizes the current control feedback loop to modify the magnitude of the output current $I_{M1}$ by modifying the reference current of the current source 116, thereby improving the precision of the output pulsed laser signal.

Figure 2:
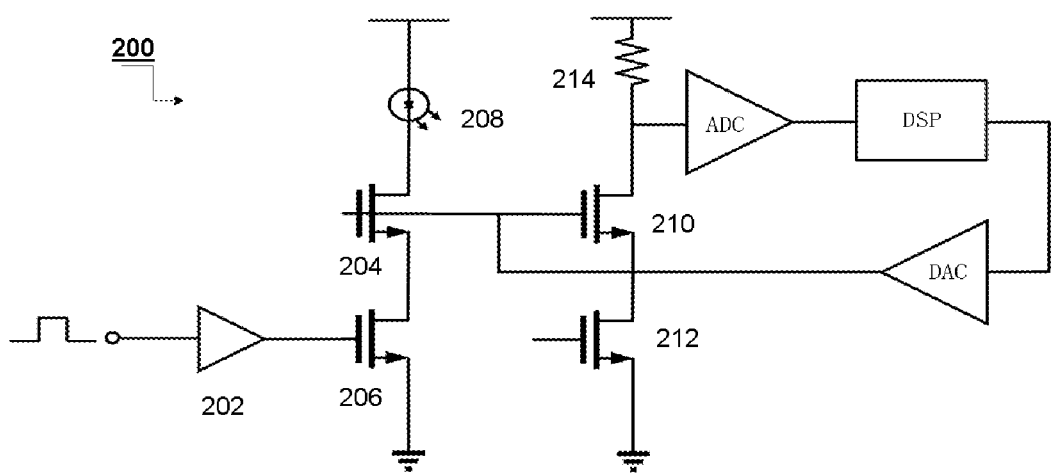
FIG. 2 illustrates a pulsed laser driver according to another embodiment.

FIG. 2 illustrates a pulsed laser driver 200 according to another embodiment. The pulsed laser driver 200 includes a pulsed laser signal generating module and a feedback control module. The pulsed laser signal generating module includes a pre-driver 202, a switch transistor 204, a switch transistor 206, and a laser 208. The switch transistor 204 and the switch transistor 206 of this embodiment are FETs. According to some embodiments of the present disclosure, the switch transistor 204 and the switch transistor 206 may be BJTs. One end of the laser 208 is supplied with a bias voltage, and the other end of the laser 208 is connected to the drain terminal of the switch transistor 204. The source terminal of the switch transistor 204 is connected to the drain terminal of the switch transistor 206. The pre-driver 202 receives an input pulsed signal. The output end of the pre-driver 202 is connected to the gate terminal of the switch transistor 206. The switch transistor 206 switches between an ON state and an OFF state according to the input pulsed signal. When the switch transistor 206 is in the ON state, the output current of the pulsed laser driver 200 is the current flowing from the drain terminal of the switch transistor 204 to the source terminal of the switch transistor 204, and the corresponding output voltage of the pulsed laser driver 200 is the drain terminal voltage of the switch transistor 204. The magnitude of the output current of the pulsed laser driver 200 is determined by the gain terminal voltage of the switch transistor 204. When the switch transistor 206 is in the OFF state, the output current of the pulsed laser driver 200 is zero. By switching the switch transistor 206 between the ON state and the OFF state, the switching of the output current is achieved. Also, a pulsed current is generated as a result of the switching of the switch transistor 206 between the ON state and the OFF state. The pulsed current is supplied to the laser 208 to generate an output pulsed laser signal. Because the output voltage is the drain terminal voltage of the switch transistor 204, the switch transistor 204 may be a high-voltage transistor to sustain a bigger output voltage. Correspondingly, the switch transistor 206 may be a low-voltage transistor and therefore has a smaller parasitic capacitance, and the gate terminal of the low-voltage switch transistor 206 requires a smaller voltage swing, thereby providing a higher switching speed for the switch transistor 206 and a faster switching speed for the output current consequentially. The pulsed laser driver 200 utilizes the high-voltage switch transistor 204 to support a higher output voltage, and meanwhile utilizes the low-voltage switch transistor 206 to achieve high-speed switching of the output current, thereby providing a high-speed, high-voltage-margin, high-power pulsed laser driver. Further, the pulsed laser driver 200 utilizes the input pulsed signal to control the switch transistor 206 to switch between the ON state and the OFF state, and therefore controls the switching of the output current, thereby modulating the output pulsed laser signal according to the input pulsed signal. The feedback control module of the pulsed laser driver 200 includes a current feedback digital control loop that is formed by a switch transistor 210, a switch transistor 212, a resistor 214, an Analog-to-Digital Converter ("ADC"), a Digital-Signal-Processor ("DSP"), and a Digital-to-Analog Converter (DAC). The gate terminal voltage of the switch transistor 210 is associated with the gate terminal voltage of the switch transistor 204. The voltage on one end of the resistor 214 is transformed into a digital signal by the ADC, and the digital signal is transmitted to the DSP. The DSP calculates and determines the output control signal that is transformed into an analog signal by the DAC, thereby controlling the gate terminal voltage of the switch transistor 210 and the associated gate terminal voltage of the switch transistor 204, further controlling the magnitude of the output current of the pulsed laser driver 200. Therefore, the pulsed laser driver 200 utilizes the current feedback digital control loop to improve the precision of the output pulsed laser signal.

Figure 3:
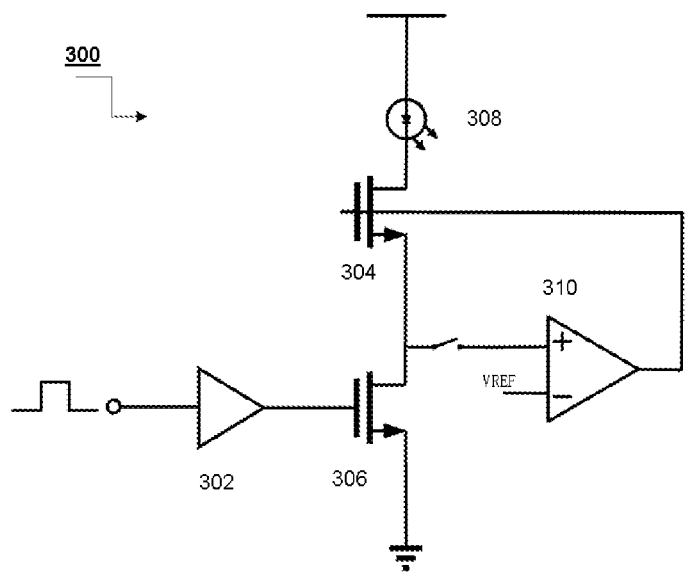
FIG. 3 illustrates a pulsed laser driver according to another embodiment.

FIG. 3 illustrates a pulsed laser driver 300 according to another embodiment. The pulsed laser driver 300 includes a pulsed laser signal generating module and a feedback control module. The pulsed laser signal generating module includes a pre-driver 302, a switch transistor 304, a switch transistor 306, and a laser 308. The switch transistor 304 and the switch transistor 306 of this embodiment are FETs. According to some embodiments of the present disclosure, the switch transistor 304 and the switch transistor 306 may be BJTs. One end of the laser 308 is supplied with a bias voltage, and the other end of the laser 308 is connected to the drain terminal of the switch transistor 304. The source terminal of the switch transistor 304 is connected to the drain terminal of the switch transistor 306. The pre-driver 302 receives an input pulsed signal. The output end of the pre-driver 302 is connected to the gate terminal of the switch transistor 306. The switch transistor 306 switches between an ON state and an OFF state according to the input pulsed signal. When the switch transistor 306 is in the ON state, the output current of the pulsed laser driver 300 is the current flowing from the drain terminal of the switch transistor 304 to the source terminal of the switch transistor 304, and the corresponding output voltage of the pulsed laser driver 300 is the drain terminal voltage of the switch transistor 304. The magnitude of the output current of the pulsed laser driver 300 is determined by the gain terminal voltage of the switch transistor 304. When the switch transistor 306 is in the OFF state, the output current of the pulsed laser driver 300 is zero. By switching the switch transistor 306 between the ON state and the OFF state, the switching of the output current is achieved. Also, a pulsed current is generated as a result of the switching of the switch transistor 306 between the ON state and the OFF state. The pulsed current is supplied to the laser 308 to generate an output pulsed laser signal. Because the output voltage is the drain terminal voltage of the switch transistor 304, the switch transistor 304 may be a high-voltage transistor to sustain a bigger output voltage. Correspondingly, the switch transistor 306 may be a low-voltage transistor and therefore has a smaller parasitic capacitance, and the gate terminal of the low-voltage switch transistor 306 requires a smaller voltage swing, thereby providing a higher switching speed for the switch transistor 306 and a faster switching speed for the output current consequentially. The pulsed laser driver 300 utilizes the high-voltage switch transistor 304 to support a higher output voltage, and meanwhile utilizes the low-voltage switch transistor 306 to achieve high-speed switching of the output current, thereby providing a high-speed, high-voltage-margin, high-power pulsed laser driver. Further, the pulsed laser driver 300 utilizes the input pulsed signal to control the switch transistor 306 to switch between the ON state and the OFF state, and therefore controls the switching of the output current, thereby modulating the output pulsed laser signal according to the input pulsed signal. The feedback control module of the pulsed laser driver 300 includes a voltage feedback analog control loop that is formed by an amplifier 310, the switch transistor 304, and the switch transistor 306. The output end of the amplifier 310 is connected to the gate terminal of the switch transistor 304. One of the input ends of the amplifier 310 is connected to the drain terminal of the switch transistor 306, and the other is connected to a reference voltage VREF. When the switch transistor 306 is in the ON state, the switch transistor 306 is equivalent to a resistor, and the current of the switch transistor 306 may be obtained by sampling the drain terminal voltage of the switch transistor 306. The current of the switch transistor 306 has the same magnitude of that of the output current of the pulsed laser driver 300. The differential voltage between the sampled drain terminal voltage of the switch transistor 306 and the reference voltage VREF, is amplified by the amplifier 310 to provide the control signal for the gate terminal voltage of the switch transistor 304. When the voltage feedback analog control loop converges, the magnitude of the output current of the pulsed laser driver 300 is determined by the magnitude of the reference voltage VREF. Therefore, the pulsed laser driver 300 utilizes the voltage feedback analog control loop to improve the precision of the output pulsed laser signal.

Figure 4:
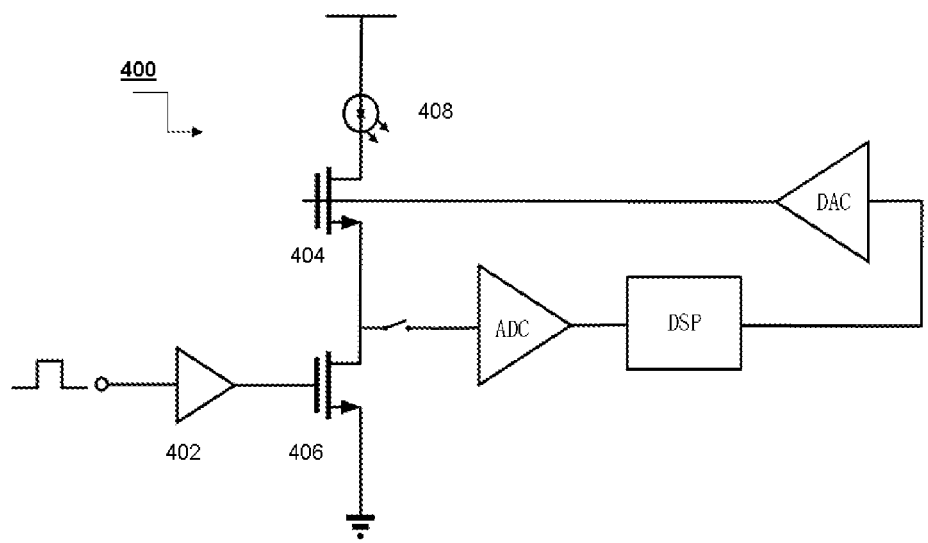
FIG. 4 illustrates a pulsed laser driver according to another embodiment.

FIG. 4 illustrates a pulsed laser driver 400 according to another embodiment. The pulsed laser driver 400 includes a pulsed laser signal generating module and a feedback control module. The pulsed laser signal generating module includes a pre-driver 402, a switch transistor 404, a switch transistor 406, and a laser 408. The switch transistor 404 and the switch transistor 406 of this embodiment are FETs. According to some embodiments of the present disclosure, the switch transistor 404 and the switch transistor 406 may be BJTs. One end of the laser 408 is supplied with a bias voltage, and the other end of the laser 408 is connected to the drain terminal of the switch transistor 404. The source terminal of the switch transistor 404 is connected to the drain terminal of the switch transistor 406. The pre-driver 402 receives an input pulsed signal. The output end of the pre-driver 402 is connected to the gate terminal of the switch transistor 406. The switch transistor 406 switches between an ON state and an OFF state according to the input pulsed signal. When the switch transistor 406 is in the ON state, the output current of the pulsed laser driver 400 is the current flowing from the drain terminal of the switch transistor 404 to the source terminal of the switch transistor 404, and the corresponding output voltage of the pulsed laser driver 400 is the drain terminal voltage of the switch transistor 404. The magnitude of the output current of the pulsed laser driver 400 is determined by the gain terminal voltage of the switch transistor 404. When the switch transistor 406 is in the OFF state, the output current of the pulsed laser driver 400 is zero. By switching the switch transistor 406 between the ON state and the OFF state, the switching of the output current is achieved. Also, a pulsed current is generated as a result of the switching of the switch transistor 406 between the ON state and the OFF state. The pulsed current is supplied to the laser 408 to generate an output pulsed laser signal. Because the output voltage is the drain terminal voltage of the switch transistor 404, the switch transistor 404 may be a high-voltage transistor to sustain a bigger output voltage. Correspondingly, the switch transistor 406 may be a low-voltage transistor and therefore has a smaller parasitic capacitance, and the gate terminal of the low-voltage switch transistor 406 requires a smaller voltage swing, thereby providing a higher switching speed for the switch transistor 406 and a faster switching speed for the output current consequentially. The pulsed laser driver 400 utilizes the high-voltage switch transistor 404 to support a higher output voltage, and meanwhile utilizes the low-voltage switch transistor 406 to achieve high-speed switching of the output current, thereby providing a high-speed, high-voltage-margin, high-power pulsed laser driver. Further, the pulsed laser driver 400 utilizes the input pulsed signal to control the switch transistor 406 to switch between the ON state and the OFF state, and therefore controls the switching of the output current, thereby modulating the output pulsed laser signal according to the input pulsed signal. The feedback control module of the pulsed laser driver 400 includes a voltage feedback digital control loop that is formed by an ADC, a DSP, a DAC, the switch transistor 404, and the switch transistor 406. When the switch transistor 406 is in the ON state, the switch transistor 406 is equivalent to a resistor. The drain terminal voltage of the switch transistor 406 may be sampled, then transformed into a digital signal by the ADC. The DSP calculates and determines a control signal that is transformed into an analog signal by the DAC, thereby controlling the gate terminal voltage of the switch transistor 404, further controlling the magnitude of the output current of the pulsed laser driver 400. Therefore, the pulsed laser driver 400 utilizes the voltage feedback digital control loop to improve the precision of the output pulsed laser signal.

The switch transistors indicated in some embodiments of the present disclosure, may be in BJT structures, or may be in FET structures. With reference to FIGS. 1 to 4, according to some embodiments of the present disclosure, the switch transistors of the pulsed laser signal generating modules of the pulsed laser drivers may be in FET structures, and therefore have advantages of low power consumption, simple driving circuit, and small base terminal driving current. According to some embodiments of the present disclosure, the switch transistors in FET structures, may be Junction Field Effect Transistors ("JFETs"), or Metal Oxide Semiconductor Field Effect Transistors ("MOSFETs").

The feedback control modules of some embodiments of the present disclosure control the gate terminal voltages of the high-voltage switch transistors, to further control the magnitudes of the output currents of the pulsed laser drivers, improving the precisions of the output pulsed laser signals. According to some embodiments of the present disclosure, a feedback control module of an example pulsed laser driver may control the magnitude of the output current of the pulsed laser driver by a series-connected current source in the output branch. According to some embodiments of the present disclosure, a feedback control module of an example pulsed laser driver may control the output current of the pulsed laser driver by controlling the gate terminal voltage of the low-voltage switch transistor.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A pulsed laser driver, the pulsed laser driver comprising:
a laser;
a first switch transistor connected to the laser, the first switch transistor defining an output voltage of the pulsed laser driver; and
a second switch transistor connected to the first switch transistor, wherein the second switch transistor generates a pulsed current that flows through the first switch transistor to the laser to generate an output pulsed laser signal associated with the output voltage of the pulsed laser driver;
wherein the first switch transistor and the second switch transistor are both field effect transistors, each of the first switch transistor and the second switch transistor including a gain terminal, a drain terminal, and a source terminal respectively, the drain terminal of the first switch transistor is connected to the laser, the source terminal of the first switch transistor is connected to the drain terminal of the second switch transistor.

2. The pulsed laser driver of claim 1, wherein the second switch transistor generates the pulsed current by switching between an ON state and an OFF state.

3. The pulsed laser driver of claim 2, wherein when the second switch transistor is in the ON state, an output current of the pulsed laser driver corresponding to the output voltage of the pulsed laser driver flows through the first switch transistor.

4. The pulsed laser driver of claim 3, wherein when the second switch transistor is in the OFF state, the output current of the pulsed laser driver is zero.

5. The pulsed laser driver of claim 4, wherein a magnitude of the output current of the pulsed laser driver is adjustable based on a terminal voltage of the first switch transistor.

6. The pulsed laser driver of claim 1, wherein the output voltage of the pulsed laser driver is the drain terminal voltage of the first switch transistor.

7. The pulsed laser driver of claim 1, wherein the second switch transistor generates the pulsed current according to the gate terminal voltage of the second switch transistor.

8. The pulsed laser driver of claim 1, wherein a magnitude of an output current of the pulsed laser driver is adjustable according to the gate terminal voltage of the first switch transistor.

9. The pulsed laser driver of claim 1, wherein the first switch transistor is a bipolar junction transistor.

10. The pulsed laser driver of claim 1, wherein the second switch transistor is a bipolar junction transistor.

11. The pulsed laser driver of claim 1, further comprising a pre-driver connected to the second switch transistor, wherein the second switch transistor generates the pulsed current according to an input pulsed signal received by the pre-driver.

12. The pulsed laser driver of claim 11, wherein the pre-driver matches an equivalent input impedance of the second switch transistor with a driving ability of the input pulsed signal.

13. The pulsed laser driver of claim 5, further comprising a feedback control module for controlling the terminal voltage of the first switch transistor.

14. The pulsed laser driver of claim 8, further comprising a feedback control module for controlling the gate terminal voltage of the first switch transistor.

15. A pulsed laser driver, the pulsed laser driver comprising:
a laser;
a first field effect transistor connected to the laser; and
a second field effect transistor connected to the first field effect transistor, each of the first field effect transistor and the second field effect transistor including a gain terminal, a drain terminal, and a source terminal respectively,
wherein an output voltage of the pulsed laser driver is the drain terminal voltage of the first field effect transistor, the second field effect transistor generates a pulsed current that flows through the first field effect transistor to the laser to generate an output pulsed laser signal associated with the output voltage of the pulsed laser driver, the second field effect transistor generates the pulsed current according to the gate terminal voltage of the second field effect transistor;

wherein the drain terminal of the first field effect transistor is connected to the laser, the source terminal of the first field effect transistor is connected to the drain terminal of the second field effect transistor.

16. The pulsed laser driver of claim 15, wherein the second field effect transistor generates the pulsed current by switching between an ON state and an OFF state.

17. The pulsed laser driver of claim 15, further comprising a pre-driver connected to the gate terminal of the second field effect transistor, wherein the second field effect transistor generates the pulsed current according to an input pulsed signal received by the pre-driver.

18. A pulsed laser driver, the pulsed laser driver comprising:
 a laser;
 a first field effect transistor connected to the laser; and
 a second field effect transistor connected to the first field effect transistor, each of the first field effect transistor and the second field effect transistor including a gain terminal, a drain terminal, and a source terminal respectively, wherein an output voltage of the pulsed laser driver is the drain terminal voltage of the first field effect transistor, the second field effect transistor generates a pulsed current that flows through the first field effect transistor to the laser to generate an output pulsed laser signal associated with the output voltage of the pulsed laser driver, the second field effect transistor generates the pulsed current according to the gate terminal voltage of the second field effect transistor, a magnitude of an output current of the pulsed laser driver is adjustable according to the gate terminal voltage of the first field effect transistor, the pulse laser driver further comprising a feedback control module for controlling the gate terminal voltage of the first field effect transistor;

wherein the drain terminal of the first field effect transistor is connected to the laser, the source terminal of the first field effect transistor is connected to the drain terminal of the second field effect transistor.

* * * * *